United States Patent [19]

Rothschild et al.

[11] Patent Number: 4,888,203
[45] Date of Patent: Dec. 19, 1989

[54] HYDROLYSIS-INDUCED VAPOR DEPOSITION OF OXIDE FILMS

[75] Inventors: Mordechai Rothschild, Newton; Jerry G. Black, Lincoln; Daniel J. Ehrlich, Lexington, all of Mass.

[73] Assignee: Massachusetts Institute of Technology, Cambridge, Mass.

[21] Appl. No.: 120,350

[22] Filed: Nov. 13, 1987

[51] Int. Cl.[4] .......................... B05D 3/06; B05D 5/12
[52] U.S. Cl. .............................. 427/53.4; 427/126.3; 427/126.4; 427/126.5; 427/256; 427/261; 427/262; 427/301; 427/322; 427/119.2
[58] Field of Search ................ 427/255.3, 53.1, 126.3, 427/419.2, 491.3, 491.5, 271, 322, 264, 301, 62, 261, 282, 256, 126.4, 126.5

[56] References Cited

U.S. PATENT DOCUMENTS

| | | | |
|---|---|---|---|
| 2,461,302 | 2/1949 | Truhlar | 427/255.3 |
| 2,771,378 | 11/1956 | Motter | 427/255.3 |
| 3,306,768 | 2/1967 | Peterson | 427/255.3 |
| 3,571,703 | 5/1970 | Peterson | 427/255.3 |
| 3,698,071 | 10/1972 | Hall | 427/255.3 |
| 3,959,105 | 6/1976 | Feneberg et al. | 204/165 |
| 3,964,549 | 7/1976 | Williams | 427/255.3 |
| 3,984,587 | 10/1976 | Lipp | 427/255.3 |
| 4,051,276 | 9/1977 | Williams | 427/255.3 |
| 4,112,148 | 9/1978 | Fonzi | 427/255.3 |
| 4,147,820 | 4/1979 | Holzl | 427/255.3 |
| 4,170,662 | 10/1979 | Weiss et al. | 427/38 |
| 4,179,311 | 12/1979 | Keller et al. | 148/1.5 |
| 4,260,649 | 4/1981 | Dension et al. | 427/53.1 |
| 4,340,617 | 7/1982 | Deutsch et al. | 427/53.1 |
| 4,359,485 | 11/1982 | Donnelly et al. | 427/53.1 |
| 4,451,498 | 5/1984 | Hashimoto | 427/255.3 |
| 4,458,994 | 7/1984 | Jain et al. | 354/4 |
| 4,490,211 | 12/1984 | Chen et al. | 156/643 |
| 4,505,985 | 3/1985 | Schmidt et al. | 427/255.3 |
| 4,514,441 | 4/1985 | Alexander | 427/255.3 |
| 4,548,834 | 10/1985 | Tsuge et al. | 427/63 |
| 4,568,632 | 2/1986 | Blum et al. | 430/322 |
| 4,608,117 | 8/1986 | Ehrlich et al. | 156/610 |
| 4,615,904 | 10/1986 | Ehrlich et al. | 427/38 |
| 4,619,894 | 10/1986 | Bozler et al. | 430/942 |
| 4,622,095 | 11/1986 | Grobman et al. | 156/635 |
| 4,626,449 | 12/1986 | Hirai et al. | 427/53.1 |
| 4,686,112 | 8/1987 | Hoffman | 427/255.3 |

FOREIGN PATENT DOCUMENTS 0111655 3/1984 European Pat. Off. .
0178654 4/1985 European Pat. Off. .
2153543A 8/1985 United Kingdom .

OTHER PUBLICATIONS

Cali et al., (1976), Applied Optics, vol. 15, No. 5:1327-1330.
Ehrlich et al., (1981), Appl. Phys. Lett. 38(1), vol. 38, No. 11:946-948.
Deutsch et al., (1979), Appl. Phys. lett. 35(2), vol. 35, No. 2:175-177.
Hanabusa et al., (1979), Appl. Phys. lett. 35(8), vol. 35, No. 8:626-627.
Andreatta et al., (1982), J. Vac. Sci. Technol, 20(3), 740-742.
Ehrlich et al, (1985), J. Vac. Sci. Technol, B 3(1), vol. 23, No. 1: 1-8.
Beatty, "Thin Films" in Handbook of Materials, Harper, ed., McGraw-Hill, Inc., 1970, pp. (11-1)-(11-19).

Primary Examiner—Janyce Bell
Attorney, Agent, or Firm—Thomas J. Engellenner

[57] ABSTRACT

Thin films (e.g. less than 100 nm thick) of a metal oxide material can be deposited on a variety of hydrophilic substrates by hydrolysis. Deposition is achieved by reacting a vapor of an appropriate metal-containing compound with water at or near the substrate's surface. The resulting deposited film can serve a variety of uses, for example, as a photo-resist in micro-electronics or in any area where protective films are useful, such as the passivation of ternary metal oxide superconductors.

14 Claims, 5 Drawing Sheets

HYDROLYSIS-INDUCED VAPOR DEPOSITION OF OXIDE FILMS

The United States Government has rights in this invention pursuant to the Department of the Air Force Contract No. F19628-85-C-0002.

BACKGROUND OF THE INVENTION

The invention generally relates to thin film deposition and, more particularly, to deposition of metal oxide films.

Thin films are employed at present for a wide range of industrial purposes. For example, thin films find particular utility in the electronics field as a photo-resists during photo-lithography. Such photo-resists are used to define patterns on a substrate for conductive paths, diffusion, ion implantation, etc., to create large-scale intergrated circuits. Thin films, particularly insulating thin films, also find use in passivating electronic circuits after they are formed.

Protective thin films also find applications outside the electronic field. For example, thin films have been used or suggested for use to protect articles, devices or other structures of a variety of materials from attack by environmental agents. Examples of such articles and devices range from works of art to industrial machines.

Numerous methods are known in the prior art for film deposition, including sputtering, evaporation, plating, reactive chemical processes and the like. However, these deposition techniques require considerable expenditures of energy, either in the form of heating of materials, induction of RF fields, plasma formation or laser initiation of chemical reactions.

Sputter deposition involves the ejection of material from a target material source following the impact of energetic sputtering ions. Typically, the target material source and the receiving substrate are arranged within an evacuated chamber in spaced relation on opposing electrodes. A potential impressed across the electrodes serves both to produce a gas plasma between the electrodes and to cause gas ions from the plasma to bombard the raw material source. The ion bombardment knocks off molecules of the raw material, or locally heats the raw material, so as to boil off or evaporate the molecules, causing them to fly in all directions. Some of these projectiles have trajectories which cause them to impinge upon the substrate, eventually building up a thin film. While the film thickness can be fairly accurately controlled, the impacting molecules have high kinetic energy and can damage delicate substrates through the momentum of the collisions themselves or through transformation of the kinetic energy into internal excitation and local heating.

In another method, commonly known as "evaporation" or "thermal vapor deposition", the raw material to be deposited is placed in a heated crucible arranged within an evacuated chamber and heated to a temperature at least sufficient to cause evaporation. The substrate is arranged in a position over the crucible facing the raw material, so as to intercept the evaporant, which is deposited on the facing surface of the substrate. Unfortunately, in some applications, the high temperature of the evaporant can damage heat-sensitive substrates.

In still another method, commonly known as "ion plating" or "plasma plating", conductive raw material is placed within an evacuated chamber opposite a conductive substrate. A high voltage DC field is produced between the raw material and the substrate, the latter being the cathode of a high voltage DC circuit. The chamber is filled with a gas at a pressure sufficient to generate and sustain a plasma discharge. The raw material is then vaporized to form a vapor deposit on the substrate. In the presence of the plasma, a portion of the vaporized raw material becomes ionized, and the positively charged evaporant ions and positively charged gas ions are accelerated by the electric field and bombard the substrate surface to densify the vapor-deposited coating.

A variation of plasma deposition has been developed for depositing thin film, non-conductive or semiconductor coatings on a substrate. In this technique, raw materials are vapor deposited on the substrate, while the substrate is bombarded by ions of a selected gas. During the process, the substrate is maintained in an atmosphere of the selected gas, and an r.f. field is established to produce a plasma of the gas in the vicinity of the substrate. The substrate is electrically biased to attract ions from the plasma which impact on the substrate and densify the vapor deposit thereon. A disadvantage with plasma deposition techniques is that the ions impact the substrate at high kinetic energy causing local heating and possible damage to surface material of fragile or heat sensitive substrates.

Yet another deposition technique developed by one of the present inventors and colleagues is described in U.S. Pat. No. 4,340,617 issued July 20, 1982, in which it is disclosed that thin film depositions can be achieved by photo-decomposition of a gaseous material, such as trimethyl aluminum or dimethyl cadmium. In one embodiment, the gaseous material is photolytically decomposed by a laser source of energy operating at a wavelength less than 700 nm to induce metal deposition on a substrate.

There exists a need for improved deposition techniques which can provide films of selected thickness and density, regardless of the type or conductivity state of the substrate. Such techniques would be preferably gentle to the substrate surface, involving low temperatures, low energy and low impact.

In addition to the gentleness of the deposition process, it is desirable to provide for conformal deposition. The deposited material in such a process should conform to the surface of the substrate, regardless of its form and configuration.

Accordingly, an object of the invention is to provide an improved technique for forming thin films on substrates and, particularly, on heat-sensitive or fragile substrates.

Another object of the invention is to provide an improved technique for protecting exposed surfaces of articles, devices and other substrates against environment attack.

A further object of the invention is to provide thin films useful in the electronics field, for example, as photo-resists or as passivating layers.

SUMMARY OF THE INVENTION

These and other objects of the invention are achieved by depositing a metal oxide thin film, typically under 100 nm thick, over a variety of substrates, particularly, over hydrophilic substrates during a hydrolysis reaction. The deposition method entails reacting a vapor of an appropriate metal containing compound (the "metal vapor") with water at or near the substrate's surface. In some instances, the reaction can proceed by obtaining the needed moisture directly from ambient air. A film of greater depth can be formed or greater deposition efficiency attained, however, by exposing the substrate surface to a selected, moisture-containing vapor (the "water vapor") to assure sufficient adsorption of water in situ on the substrate surface. In the latter case, the substrate is exposed to the water vapor prior to exposing it to the active metal-containing vapor.

The deposition process is preferably carried out in a reaction chamber. The substrate is placed in the chamber, which is then purged of contaminating gas by being pumped to vacuum and then flushed. Flushing is achieved by introducing and then removing a suitable agent, such as argon gas, from the chamber. The pumping/flushing steps are repeated as needed to remove undesirable gases. After this is completed, an optional water pre-treatment step can be performed by introducing water vapor into the reaction chamber to increase water content of the substrate material. Then, following another purging, this time of the unadsorbed water vapor, the metal vapor is introduced into the reaction chamber at selected pressure and low temperature, i.e., under approximately 100° C., the conventional evaporation point of water. Preferably, the temPerature in the chamber during the reaction ranges from about room temperature of 20° C. to about 80° C. The metal vapor is permitted to chemically react with the moisture-laden substrate for a selected length of time.

The purging, water-vapor-introducing, Purging and metal-vapor-introducing steps can be repeated in sequence to attain the desired film thickness and characteristics. Process control can also be effected by controlling the chemical content, pressure and temperature of the vapors, and the duration of the respective reaction steps. In some instances, the active vapor and a controlled amount of moisture can be introduced together such that the hydrolysis reaction occurs within the chamber rather than at the substrate surface.

A wide variety of metal oxide films can be formed in accordance with the present invention. (The term "metal" is used in its broadly sense to include not only convention conductors, such as alumnium, chromium, etc. but also semiconductors such as silicon, where the oxides of such elements are similarly regarded as a useful film materials). Aluminum oxide, for example, can be formed according to the invention by hydrolysis of an aluminum-containing vapor, such as an aluminum halide (e.g. aluminum chloride) or an aluminum alkyl (e.g. trimethyl aluminum or dimethyl aluminum chloride). Titanium oxides can be formed by hydrolysis of titanium halides and oxyhalides (e.g. chlorides and oxychlorides) or titanium alkyls. Silicon oxides can be formed by hydrolysis of silicon halides (e.g. silicon tetrachloride) or silicon alkyls (e.g. dichlorodimethyl silicon). Similar reactions of appropriate halides, oxyhalides or alkyls (including substituted alkyls) can be employed to deposit oxides of tungsten, chromium, vanadium, zinc and the like. In the case of tungsten oxides, one preferred active vapor is tungsten fluoride. In the case of zinc oxides, a preferred active vapor is diethyl zinc. In some instances, the reaction can also be assisted or accelerated photolytically, such as by laser irradiation.

The resulting deposition is relatively dense, of controlled thickness and conforms in all directions to the surface or surfaces of the substrate, regardless of variations in configuration and form. Moreover, the present invention can be practiced at substantial lower temperatures (e.g. at or near room temperature) and with significantly less energy expenditures to achieve high quality oxide film depositions.

The invention also finds particular utility in forming thin films on heat sensitive or chemically or physically fragile substrates. The substrate can include semiconductive or superconductive devices or an article or device which is otherwise subject to attack by environmental agents.

The invention is especially suited for the protection of superconducting devices from environmental attack. For example, high-$T_c$, ternary metal oxide (TMO) superconductors tend to react readily in air, and such oxidation can be destructive of their superconductivity, particularly when the material is deposited as a thin film. A TMO thin film has a high surface area to volume ratio compared with other geometries; and, therefore, its bulk material characteristics are more sensitive to surface reaction with water vapor and, if heated, oxygen components of air. The invention can be practiced so as to deposit a film of metal oxide over a TMO superconductor and thereby protect the superconductor from its environment.

As another illustrative practice of the invention, the film can be used as a photo-resist in multi-layer lithographic patterning during semiconductor fabrication. Preferably, such a Patterning technique uses a laser system for etching. In this application, the substrate, for example, is covered by a polymeric planarizing layer, such as polyimide or polymethylmethacrylate ("PMMA"), upon which is then deposited the metallic oxide film as a second or top photo-resist or imaging layer. The technique achieves high resolution masking patterns, since it permits the imaging layer to be substantially thinner than conventional practice dictates.

Metal oxide films, deposited in accordance with the present invention, can also be used to form tri-layer photoresists. In such instances, a planarizing layer of PMMA, polyimide or the like is again deposited on a substrate followed by deposition of a metal oxide film as taught herein. Next, a conventional photoresist, such as a diazonaphthoquinone or novolak resin, is deposited as an imaging layer. In this embodiment, the metal oxide film (intermediate layer) permits a sharper image to be transferred to the planarizing layer while allowing pattern formation by conventional (non-laser) photolytic processes in the imaging layer.

The techniques disclosed herein can also be used to passivate side walls in laser-induced deep etching, or otherwise, to passivate boundary materials and exposed surfaces in micro-electronic devices, such as formed in a semiconductive wafer. Moreover, protective thin films in accordance with the invention can be used to passivate or protectively coat other apparatus and devices against attack from external chemical agents and harmful interactions with the environment. For example, works of art, such as statues, pottery, etc, as well as building materials, can receive a thin protective film conformably and uniformally applied in accordance with the invention.

The invention embraces the method of forming the film as described above, the apparatus used, as well as a structure, article or device having a film deposited by the method.

BRIEF DESCRIPTION OF THE DRAWINGS

Other objects, features, and advantages of the invention will become apparent from the following description taken together with the drawings, in which.

DETAILED DESCRIPTION

Figure 1:
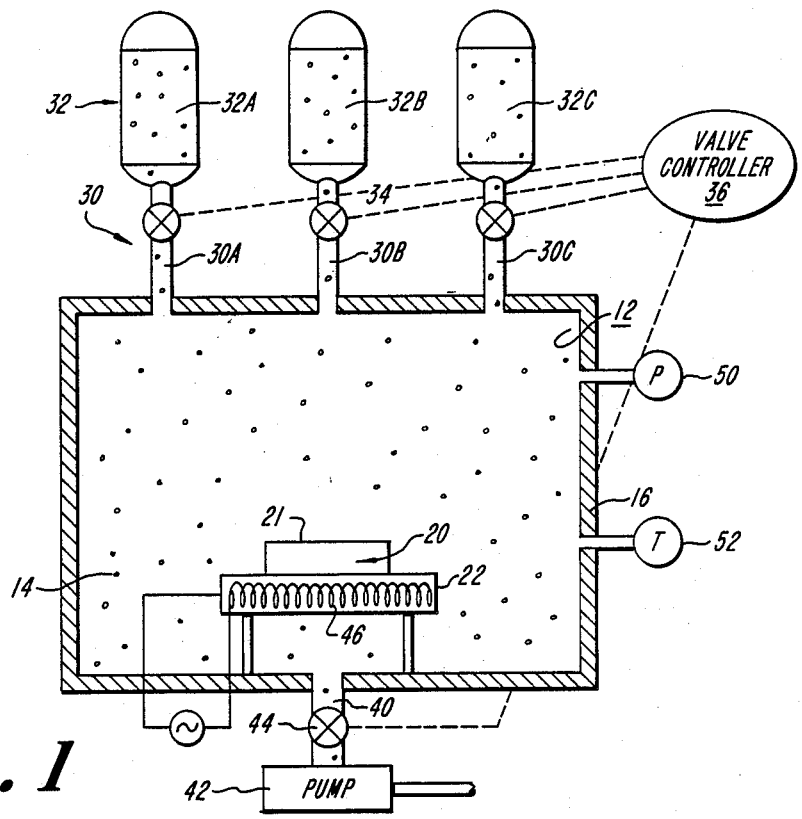
FIG. 1 is a schematic representation of a chemical deposition system in accordance with the invention.

Referring now to the drawings, FIG. 1 shows an exemplary deposition apparatus 10 in accordance with a practice of the invention. The illustrated apparatus 10 has a reaction chamber 12 containing a selected gaseous mixture 14 within gas-tight walls 16. As illustrated, a substrate 20 is disposed within the chamber 12. The substrate 20 has a hydrophilic surface 21 on which a film is to be deposited. The substrate 20 is supported, preferably along its periphery in frame-like manner, by a stage 22 so as to expose the surface 21.

As illustrated, a plurality of valved inlet pipes 30 establish fluidic communication with reservoirs 32 for the introduction of selected gases therefrom through walls 16 into the reaction chamber 12. A first inlet pipe 30A is connected to a first reservoir 32A for containing a purging agent, such as argon gas. An optional second inlet pipe 30B is connected to an optional second reservoir 32B for containing water vapor. A third inlet pipe 30C is connected to a third reservoir 32C for containing an active vapor comprising a metal compound, i.e., the aforesaid metal vapor. While each of the inlet pipes 30A, 30B, 30C are shown as incorporating a separate valve 34 for controlling the flow of gas therethrough, other valving arrangements will be apparent to one skilled in the art. The valves 34 can be manually operated, or selectively and sequentially operated automatically, for example, by a programmable valve controller 36.

As also shown, a valved outlet pipe 40 for removing gases from the reaction chamber 12 is connected to a suitable vacuum pump 42. A valve 44 controls the flow of the exhaust gases through the outlet pipe 40. Again, valve 44 can be manually operated, or selectively and sequentially operated, for example, by the valve controller 36.

For process control, the illustrated apparatus 12 has sensors for measuring the characteristics of the gases in the reaction chamber 12, such as pressure gauge 50 and temperature gauge 52.

The deposition technique in accordance with the invention uses the apparatus 10 to cause a change in the surface chemistry of the substrate 20. Film formation results from hydrolysis of the metal vapor at the substrate surface boundary.

In accordance with one practice of the invention, the reaction chamber 12 is initially purged of potentially contaminating gases. Then a metal vapor is introduced at a selected temperature and pressure, so as to form a fog which is permitted to react with water adsorbed on the substrate surface 21 on which the film is to be deposited. Hydrolysis of the metal vapor occurs at the substrate surface 21 (and, preferably, not as a gas phase reaction), accompanied by the deposition of a solid reaction product, a metal oxide film, on the substrate surface 21.

The above-mentioned purging step is attained by pumping the reaction chamber 12 to vacuum (e.g., below approximately 0.1 Torr) by operation of the vacuum pump 42, followed by the metered introduction of a dry inert gas as a flushing agent, such as argon gas, to a pressure of up to several hundred Torr. The pumping and flushing steps can be repeated as needed to assure a relatively contaminant-free environment within the reaction chamber 12.

Where the substrate 20 is constructed of a more hydrophilic material (or where at least the surface 21 is so constructed), the hydrolysis can be effected using moisture adsorbed from air into the substrate surface 21. Alternatively, and particularly where the surface 21 is constructed with mildly hydrophilic material, the deposition additionally entails the introduction of water into the substrate surface to improve the efficiency of the hydrolysis-induced deposition process.

The optional pre-treatment of the substrate with water can be performed prior to placing the substrate 20 in the reaction chamber 12, or after it is within the chamber 12 and immediately before the metal-vapor-introducing step.

For pre-treatment of the substrate 20 within the reaction chamber 12, the reaction chamber 12 is first pumped to vacuum, as explained above, and then flushed with argon from reservoir 32A, which enters through inlet pipe 30A on operation of the respective valve 34. Then, the reaction chamber 12 is pumped to vacuum again. After purging is completed, water vapor from reservoir 32B is introduced through inlet pipe 30B on activation of the respective valve 34. After the moisture in the water vapor has reacted with the substrate 20, the reaction chamber 12 is again pumped to vacuum and flushed. This is followed by the introduction of the metal vapor from reservoir 32C through inlet pipe 30C. Hydrolysis ensues on the moisture-laden surface substrate 21, accompanied by the deposition of the metal oxide. The duration of the hydrolysis reaction is preferably one minute to one hour (e.g., 40 minutes) so as to yield a high-quality, thin film.

The thickness and material characteristics (e.g., density, porosity, etc.) of the film are determined by several factors, including the ambient conditions within the reaction chamber 12, such as Pressure and temperature, chemistry of the introduced metal vapor, substrate surface chemistry (e.g., water content) and duration of the reaction steps. These process factors can be regulated to control the reaction so as to yield a desired film. A particular advantage of the present invention lies in the ability to accurately control the deposition of high quality films in short periods of time and at low temperatures (e.g. at or near room temperature).

The above-described chemical reactions which take place in the reaction chamber 12 can be accomplished at or below typical room temperatures of approximately 20° C. which permits deposition even on heat-sensitive substrate materials. Alternatively, the reaction can be carried out at slightly elevated temperatures of between approximately 20° C. and 100° C., the conventional evaporation point of water (preferably, approximately 50° C.) for speedier, more-efficient deposition. For this, a heating/cooling element 46 disposed as illustrated about stage 22 within the reaction chamber 12 is appropriately energized to control the temperature of the substrate 20. The substrate can also be cooled in some applications, for example, to increase or expedite water adsorption initially. Heater element 46 can further be employed to heat the substrate after film deposition to dry and densify the metal oxide layer.

As noted above, the active vapor can be a metal-containing halide, oxyhalide or alkyl of aluminum, titanium, silicon, chromium, vanadium, tungsten, zinc or the like. In one preferred embodiment, aluminum oxide is deposited by hydrolysis of an organo-aluminum compound. Suitable materials include, for example, trimethylaluminum ("TMA") or another aluminum alkyl. The TMA can be introduced into the reaction chamber 12 to a pressure of approximately 15 Torr. During the hydrolysis reaction, water and TMA combine to produce a waste by-product, ethane gas, and to deposit a reaction product, an aluminum oxide film, generally having the formula $Al_2O_x$ where "x" is between approximately two and five. Alternatively, other metal vapors, such as diethyl zinc, silicon tetrachloride or tungsten fluoride, can be used to deposit other metal oxides.

A wide range of substrate materials can be used in the practice of the invention. For example, the substrate can be made of a metal, such as copper, a metal alloy, a ceramic, an inorganic material, such as gallium arsenide or silicon dioxide, or an organic polymer, such as polyimide or PMMA. Since the deposition technique as described herein is gentle, for example, not involving particle bombardment or high localized heating as in the prior art described hereinabove, even heat sensitive or fragile substrate materials can be used. These include ternary metal oxides used for superconductors, lithium niobate ($LiNbO_3$) used for surface acoustic wave devices, cadmium telluride and mercury cadmium telluride used in infra-red sensors, and polyacetylene, which is an organic conductor when doped with iodine and chemically reactive with air.

Copper substrates, particularly copper films, are useful as metalizations in micro-electronics. A thin protective film on the copper can serve to chemically passivate the copper. In fact, a thin protective film deposited in accordance with the invention can serve to passivate a wide range of substrates. In micro-electronics, a thin film can be used to render layer boundaries and even portions of electric devices chemically passive.

Outside the electronics field, the film can be used to protect any article or device from attack by environmental agents. Such uses include works of art, such as statues, pottery, etc., and industrial machines, including, for example, protective coatings of automobile mufflers and exhaust pipes against corrosive environmental interactions.

Several illustrative applications of the invention shall now be described in more detail.

FIG. 2A through FIG. 2D illustrate one practice of the invention—the micro-fabrication of patterns on a semiconductive wafer using a multi-layer, more specifically, a bi-layer, photo-resist technique.

Figure 2A:
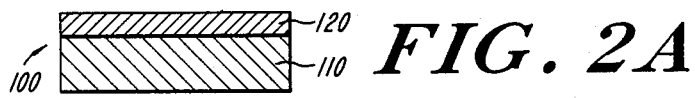
FIGS. 2A through 2E are sectional, side views of a semiconductor device at different sequential steps during processing with a photo-resist in accordance with the invention.

In FIG. 2A, a work-piece or structure 100 is shown as having a substrate 110 made of, for example, a silicon wafer on which a first, planarizing film 120 of, for example, nitro-cellulose, polyimide or polymethyl methacrylate (PMMA) has been deposited by a conventional technique. The planarizing film, for example, can be spun on the substrate 110.

Figure 2B:

In FIG. 2B, a thin oxide film photo-resist 130 is deposited on top of the planarizing layer 120 in accordance with the invention. For example, the photo-resist 130 is a thin film of Al-0 deposited by pre-treating the planarizing film with water vapor and then exposing the moisture-laden film to an active vapor of TMA for 40 minutes. A bi-layer photo-resist is thus prepared. Unlike other bi-layer resists, which typically employ a top thick film of approximately 2,000 Angstroms, the present invention permits the top film to be only five percent as thick, i.e., 100 Angstroms.

Figure 2C:
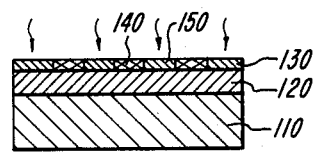

In FIG. 2C, selected regions 140 of the second photo-resist 130 are irradiated by a laser beam operating, for example, in a direct write, maskless mode or by projection or contact printing. Other regions 150 of the second photo-resist 130 are not irradiated. Within the selected irradiated regions 140, the ionic and/or molecular bonds of the Al-0 film are sufficiently weakened so as to render the material susceptible to etching. (Normally, an unprocessed Al-0 film is highly resistive to etching by conventional methods; the laser treatment serves to selectively degrade the film, locally transforming it structurally into an etchable material.) Since this film is substantially thinner than the imaging layer employed in conventional bi-layer photoresist systems, substantially increased resolution can be achieved by this process. This technique permits the definition of selected regions 140 in which the narrowest dimension is on the order of about 0.3 microns.

Figure 2D:
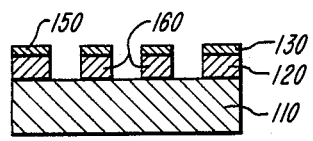

In FIG. 2D, the irradiated regions 140 of the photo-resist 130 and the vertically registered regions 160 of the planarizing layer 120 underlying the selected regions 140, have been removed, for example, by reactive ion etching ("RIE"). The regions 170 of the first photo-resist 120, underlying the non-irradiated regions 150 of the second photo-resist 130, remain unetched. Afterwards, the remaining second photo-resist 130 is stripped away.

Figure 2E:
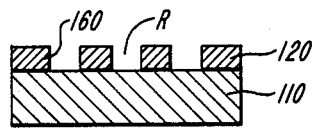

FIG. 2E shows the resulting pattern of channels, apertures or "windows," designated "R" which have been etched in the planarizing layer 120. The pattern permits the selected area-specific, subsequent processing of the structure 100. For example, a dopant can be introduced to the substrate 110 through the windows R cut in the first photo-resist 120, by diffusion, ion implantation, or other known techniques. Alternatively, a layer, not shown, of metallized ohmic contact material can be formed in the etched regions 160 of the first photo-resist 120.

Figure 3:
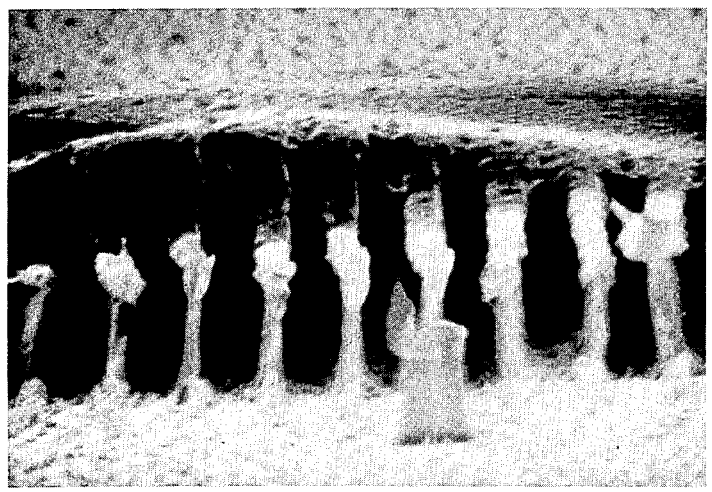
FIGS. 3 through 5 are electron-micrographs of substrates during processing in accordance with the invention.
Figure 4:
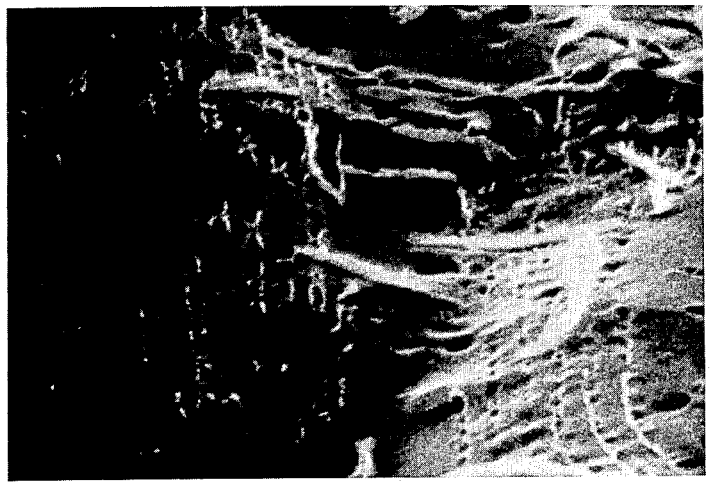
Figure 5:
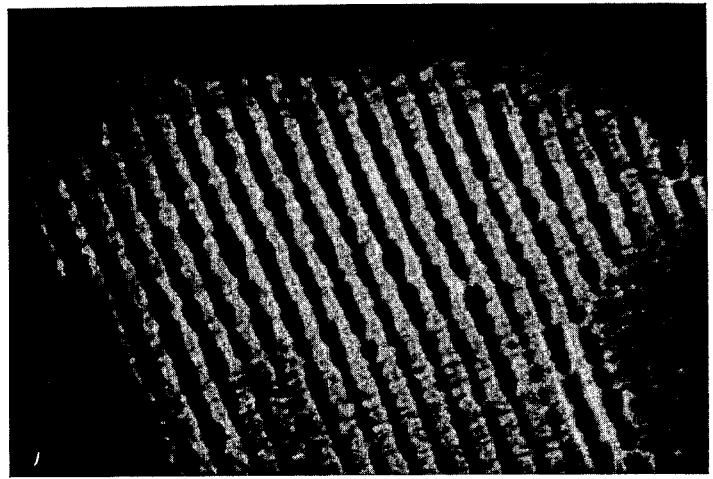

The results of the micro-fabrication steps, which have just been described, are further illustrated in FIGS. 3 through 5. These are micrographs showing various combinations of materials improved through the practice of the invention. In FIG. 3, Al-0 was used to form a photo-resist in accordance with the method described in conjunction with FIGS. 2A through 2E. The micrograph was taken after reactive ion etching (RIE) of nitro-cellulose on a silicon substrate. RIE was carried out for three minutes with oxygen ions. In FIGS. 4 and 5, PMMA was used instead of nitrocellulose. The left side of FIG. 4, showing streaking resulting from laser patterning, was taken prior to etching. In FIG. 5, relatively deep, parallel grooves resulting from RIE are clearly shown. RIE was carried out for three minutes with oxygen ions.

Another illustrative practice of the invention involves the protection of superconductive material. It has been found that ternary metal oxide ("TMO") superconductors are susceptible to environmental attack and chemical interaction, for example, due to their affinity and sensitivity to water vapor and, if heated, to oxygen. The surface of TMO superconductors reacts readily to the water vapor content of air, even at typical room temperature of approximately 20° C.

TMO superconductors embrace a wide variety of materials generally described by the formula $$MBa_2Cu_3O_x$$

where "M" is a transition metal or rare earth ion, for example, consisting of Yttrium, Scandium, Lanthanum, Neodymium, Samarium, Europium, Gadolinium, Dysprosium, Holmium, Erbium, Ytterbium, and Lutetium; and "x" is a number between approximately six and nine. In some instances, the barium component of the TMO material can also be replaced by strontium or another transition metal.

A fuller understanding of TMO superconductors, their characteristics, fabrication and patterning can be had by reference to co-pending and commonly assigned Patent Application Ser. No. 108,426, filed Oct. 14, 1987, and entitled "Formation and High Resolution Patterning of Superconductors," the disclosure of which is incorporated herein by reference.

According to the present invention, TMO superconductors can be covered with a thin protective film to substantially reduce or eliminate chemical interaction between the surface of the film and the ambient and, thus, is useful as a passivating layer.

Figure 6A:
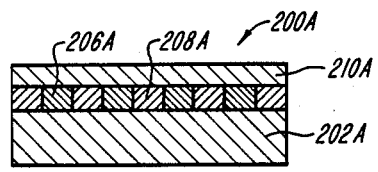
FIGS. 6A and 6B are sectional side views of ternary metal oxide film superconductors passivated in accordance with the invention.

FIG. 6A shows an exemplary superconductive structure 200A improved by the present invention. As illustrated, a substrate 202A carries a patterned TMO film. The TMO film has one or more superconductive regions 206A (four are shown) and one or more non-superconductive regions 208A (five are shown). Regions 206A and 208A are preferably integral with one another and formed by photo-thermal material transformation in accordance with the teachings of the above-referenced patent application or by other methods. Covering the TMO film is a protective film 210A, in accordance with the present invention. The protective film 210A is, for example, an Al-0 film dispoited using the apparatus 10A shown in FIG. 1. Preferably the water-vapor-introducing step is eliminated, and the requisite water content in the TMO film surface is realized by short term interaction of the surface with moisture content of ambient room air.

Figure 6B:
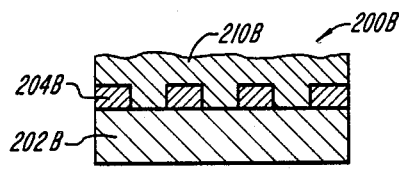

In FIG. 6B, a variation of the just-described superconductor structure 200 is shown, with similar features designated with the same reference numbers but followed by the suffix "B". Structure 200B has a substrate 202B coated with a non-planar superconductive pattern 204B, which, in turn, is coated with a protective layer 210B. The conformal nature of the deposition technique of the present invention is demonstrated in this application in achieving substantially uniform step coverage despite irregularities in surface geometry.

Figure 7:
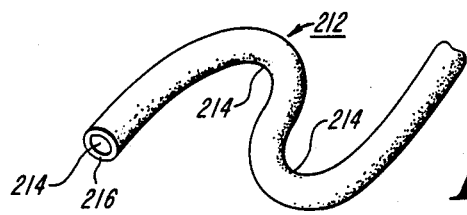
FIG. 7 is an illustrative perspective view of a superconductive wire protected in accordance with the invention.

In FIG. 7 shows a serpentine-like superconductive filament or wire 212 useful as a winding in superconducting rotating apparatus, such as motors and generators or as a component interconnect in superconductive devices. The illustrated wire 20 can have numerous folds 214 along its longitudinal extent. The wire 212 is made of a core 214 of a superconductive TMO material, and an outer protective film 216 concentrically disposed about the core 214. The protective film 216 can be formed by placing the wire 212 in the apparatus 10 of FIG. 1 or, alternatively, by adapting the present invention to be an integral part of the wire extrusion process. Thus, for example, a filament can be extruded, annealed if necessary in an appropriate environment, and then coated with a metal oxide film, according to the deposition techniques of the present invention as the wire passes from the extrusion die to a take-up spool. Alternatively, the wire can be wound in a coil or otherwise shaped and then subjected to hydrolysis-induced metal oxide deposition. Here, again, conformal deposition achieved through the present invention provides a superior film without shadowing or directional effects, despite variations in form and configuration, such as the folds 214 in the wire 212.

A further appreciation of the invention can be had by the following description of selected, non-limiting tests employing apparatus 10.

In a first test of the invention, a pre-treated NaCl window was exposed to saturated water vapor at room temperature and 16 Torr pressure. In pre-treatment, half the window was masked while the other half was exposed to a metal vapor and covered with aluminum oxide as a protective film. Then the mask was removed. After three days, the uncovered portion had foggy surfaces due to its contact and reaction with the water vapor. The covered portion remained clear. This visible effect was noticeable within approximately ten minutes.

In another test of the invention, etch resistance of Al-0 film in chlorine was examined to determine the efficacy of the film in protecting metals from "dark" etching in the presence of chlorine or similar gases. Here, a thin film (400 nm thick) of copper was pre-treated with TMA in a fashion similar to the pre-treatment of NaCl described in the preceding paragraph. After chlorination of the copper, the invention was found to be quite satisfactory in resisting etching. The uncovered portion was etched in approximately ten minutes at ten Torr $Cl_2$, while the covered portion remained clear and shiny after more than one and a half hours of exposure. Copper interconnects are typically used in semiconductor technology and are subject to chemical attack during subsequent processing of the wafer, such as by chlorine, fluorine or halogen gases. A thin film of metal oxide can be used to passivate the copper interconnects.

In yet another test, a bi-layer photo-resist was fashioned by exposing polyimide to TMA for generating a thin film of $Al_2O_3$. The resulting thin film was considered suitable as a thin imaging layer. (A thick film of an organic photo-resist, such as AZ resist, (Shipley, Newton, MA), PMMA or another common photo-resist material known in the art, which can be dry or lamp-wet developed, can be substituted for the polyimide.) The etch-resistant Al-0 layer can then be selectively ablated by an excimer laser in a single pulse (193 nm). As an alternative application, the Al-0 layer can be used to passivate side walls in laser-induced deep etching in a direct write mode.

In a further demonstration of the invention, a silicon dioxide film was deposited to provide etch protection to a polyimide on a $SiO_2$ substrate. In this instance, a planarizing layer of PI-2555 Polyimide (Dupont, Wilmington, DE) about 1 micron in thickness was spun onto an $SiO_2$ substrate and then exposed to ambient to induce moisture absorption. The chamber was then evacuated, purged with argon, and evacuated again. Silicon tetrachloride at a pressure of about 80 Torr was introduced next and allowed to react with the moisture laden substrate at room temperature for about 15 minutes to provide an $SiO_2$ film on top of the polyimide. The $SiO_2$-coated Polyimide and an uncoated control polyimide of identical thickness were then both etched by reactive ion etching in oxygen. The coated polyimide was protected from etching by the $SiO_2$ film for about five minutes while the uncoated polyimide immediately began to erode. After the initial five minutes during which the $SiO_2$ protective film was stripped away, both polyimides continued to erode at the same rate.

The invention can be embodied in other specific forms without departing from the spirit or essential characteristics thereof. The described embodiments of the invention are to be considered in all respects as illustrative and not restrictive; the scope of the invention being indicated by the appended claims rather than the foregoing description; and all changes which come within the meaning and range of equivalency of the claims are, therefore, intended to be embraced therein.

Having described this invention, what is claimed as new and secured by Letters Patent is:

1. A method of forming a protective, metal oxide, film upon a surface of a substrate, the method comprising: exposing a surface of a substrate to water vapor, such that water is adsorbed by the substrate to form a moisture-laden surface, and reacting the moisture-laden surface with a hydrolyzable, active vapor of a metal compound, at a temperature below about 100° C. to induce hydrolysis of the vapor and resulting deposition of a metal oxide film on said surface.

2. The method of claim 1 wherein the method further comprises: exposing said substrate to water vapor in a reaction chamber prior to exposure to said active vapor, such that water is adsorbed by said surface of said substrate and then purging any remaining water vapor from the chamber by flushing with an inert gas.

3. The method of claim 1 wherein said active vapor is a compound selected from the group of aluminum halides, aluminum alkyls, titanium halides, titanium oxyhalides, titanium alkyls, zinc halides, zinc alkyls, tungsten halides, tungsten alkyls, chromium halides, chromium oxyhalides, chromium alkyls, silicon halides, silicon alkyls, vanadium halides, vanadium oxyhalides and vanadium alkyls, and mixtures thereof.

4. The method of claim 3 wherein said compound is trimethyl aluminum.

5. The method of claim 3 wherein said compound is silicon tetrachloride.

6. The method of claim 1 wherein said substrate comprises an organic polymer.

7. The method of claim 6 wherein said organic polymer comprises a polyimide.

8. The method of claim 6 wherein said organic polymer comprises a polymethylmethacrylate.

9. The method of claim 1 wherein said substrate comprises a metal, and said film producing step includes forming a passivating layer over said metal.

10. The method of claim 1 wherein said substrate includes at least one electronic device, and said film producing step includes passivating at least a portion of said substrate.

11. The method of claim 1 wherein the method further includes maintaining said substrate at a temperature between about 20° C. and about 80° C.

12. The method of claim 1 wherein the method further includes improving the efficiency of the reaction by photo-irradiating the substrate during hydrolysis.

13. The method of claim 1 wherein the method further includes forming a pattern in said metal oxide film by exposing regions thereof to laser radiation.

14. The method of claim 1 wherein the method further depositing a photoresist above said metal oxide film.

* * * * *